(12) United States Patent
You

(10) Patent No.: US 7,106,648 B2
(45) Date of Patent: Sep. 12, 2006

(54) X-ADDRESS EXTRACTOR AND MEMORY FOR HIGH SPEED OPERATION

(75) Inventor: Min Young You, Chungcheongbuk-do (KR)

(73) Assignee: Hynix Semiconductor, Inc., Kyungki-do (KR)

( * ) Notice: Subject to any disclaimer, the term of this patent is extended or adjusted under 35 U.S.C. 154(b) by 122 days.

(21) Appl. No.: 10/878,824

(22) Filed: Jun. 28, 2004

(65) Prior Publication Data

US 2005/0128857 A1 Jun. 16, 2005

(30) Foreign Application Priority Data

Dec. 15, 2003 (KR) ...................... 10-2003-0091674

(51) Int. Cl.
*G11C 8/00* (2006.01)
*G11C 7/00* (2006.01)

(52) U.S. Cl. ............. 365/230.06; 365/194; 365/230.01

(58) Field of Classification Search ...................... None
See application file for complete search history.

(56) References Cited

U.S. PATENT DOCUMENTS 6,353,572 B1 * 3/2002 Yagishita ............... 365/230.08
6,552,957 B1 * 4/2003 Yagishita ..................... 365/233
6,754,783 B1 * 6/2004 Tsern et al. .................. 711/144
6,781,919 B1 * 8/2004 Mizuhashi .................. 365/233

* cited by examiner

*Primary Examiner*—Thong Q. Le
(74) *Attorney, Agent, or Firm*—Marshall, Gerstein & Borun LLP

(57) ABSTRACT

The disclosed is a memory such DRAM (dynamic random access memory), particularly an X-address extractor, an X-address extraction method and a memory adaptable to a high speed operation. A DRAM receives X and Y-addresses through an address line. The X-address is input through a command line when an active command is input to the DRAM, and the Y-address is input when a read/write command is input to the DRAM. The X-address abstractor performs a function of extracting the X-address from the X and Y addresses transferred through the address line. A conventional X-address extractor has a problem that the X-address has a different value when a selection signal changes to logic '0' from logic '1' after an address signal changes to another value from an X-address. The present X-address extractor includes a selection signal generator, a delayer, a latch and an X-address switch, without the problem of the conventional art.

9 Claims, 10 Drawing Sheets

X-ADDRESS EXTRACTOR AND MEMORY FOR HIGH SPEED OPERATION

BACKGROUND

1. Field of the Invention

The present invention relates to a memory such as a DRAM (dynamic random access memory), and particularly to an X-address extractor and a memory adaptable to a high speed operation.

2. Discussion of Related Art

A DRAM receives an X-address and Y-address through an address line. The X-address is input through a command line when an active command is input to the DRAM, and the Y-address is input when a read/write command is input to the DRAM. The X-address extractor performs a function of extracting the X-address among the X and Y addresses transferred through the address line.

Hereinafter, a conventional X-address extractor will be described with reference to FIGS. 1 and 2.

FIG. 1 is a block diagram of an X-address abstractor according to a conventional art. In FIG. 1, the X-address extractor includes a selection signal generator 10 and an X-address switch 120.

The selection signal generator 110 inputs a command signal CMD and then outputs a selection signal SEL. The command signal CMD is output as the selection signal SEL at rising and falling edges of a clock signal CLK.

The X-address switch 120 receives an address signal ADD and the selection signal SEL and then outputs an X-address signal XADD. When the selection signal SEL is logic '1', the address signal ADD becomes the X-address signal XADD. When the selection signal SEL is logic '0', the address signal ADD retains its previous value.

By such an operation, the X-address extractor extracts the X-address signal XADD from the address signal ADD.

However, as illustrated in FIG. 2, the selection signal SEL is considerably delayed from the command signal CMD because it is operable in sync with the clock signal CLK. As the address signal ADD is transferred to the X-address signal XADD by the selection signal SEL, the X-address signal XADD is much delayed than the address signal ADD. Furthermore, the X-address signal XADD has a different value not the X-address when the selection signal SEL changes to logic '0' from logic '1' after the address signal ADD changes to another value from an X-address. Such a problem should be overcome for an improvement of a high speed DRAM because it would be more serious as the DRAM is improved in a higher speed.

SUMMARY OF THE INVENTION

Therefore, the present invention is directed to solve the aforementioned problem, providing an X-address extractor and a memory capable of reducing a delay between an address signal and an X-address signal.

Another object of the present invention is to provide an X-address extractor and a memory, by which an X-address signal has a value of the X-address even when the selection signal changes to logic '0' from logic '1' after an address signal changes to another value from an X-address.

In order to accomplish the objects, a first aspect of the present invention provides an address extractor for obtaining an output address signal in response to a command signal, an address signal, and a clock signal, comprising: a first element for outputting either a rising edge or a falling edge of the clock signal with a delay for a predetermined time; a second element for outputting a selection signal with a logic value variable in accordance with that the command signal is a predetermined command value; a third element for outputting the selection signal or retaining a previous output value, in accordance with a logic value of the clock signal; a fourth element for outputting the address signal or retaining a previous value, in accordance with a logic value of an output signal of the first element; and a fifth element for outputting an output signal of the fourth element as the output address signal or retaining a previous value, in accordance with a logic value of an output signal of the third element.

A second aspect of the present invention provides an address extractor for generating an output address signal in response to a command signal transferring a first command and a second command but the first command, an address signal transferring a first address and a second address but the first address, and a clock signal, the address extractor comprising: a first element for outputting a command clock signal and an address clock signal, the command clock signal having a first edge in a period when the command signal is a the first command and a second edge after the period of the first command, the command clock signal having a first logic value before the first edge and a second logic value after the first edge, the address clock signal having a third edge in a period when the address signal is the first address and a fourth edge after the period of the first address, the address clock signal having a third logic value before the third edge and a fourth logic value after the third edge, the second edge being positioned before the fourth edge; a second element for outputting a fifth logic value when the command clock signal is the first logic value and the command signal is the first command, outputting a sixth logic value when the command clock signal is the first logic value and the command signal is the second command, and retaining a previous output value when the command clock signal is the second logic value; a third element for outputting the address signal when the address clock signal is the third logic value and retaining a previous output value when the address clock signal is the fourth logic value; and a fourth element for outputting an output signal of the third element as the output address signal when an output signal of the second element is the fifth logic value and retaining a previous output value when the output signal of the second element is the sixth logic value.

A third aspect of the present invention provides a memory comprising: a row address extractor either the first or second aspects, for outputting a row address in response to a clock signal, an address signal, and a command signal; a column address generator for creating a column address in response to the address signal and the command signal; a row decoder for selecting a row line in accordance with the row address; a column decoder for selecting a column line in accordance with the column address; and a memory cell array including plurality of memory cells which are readable or writable with data, being designated with a low line selected by the X-address signal and a column line selected by the Y-address signal.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
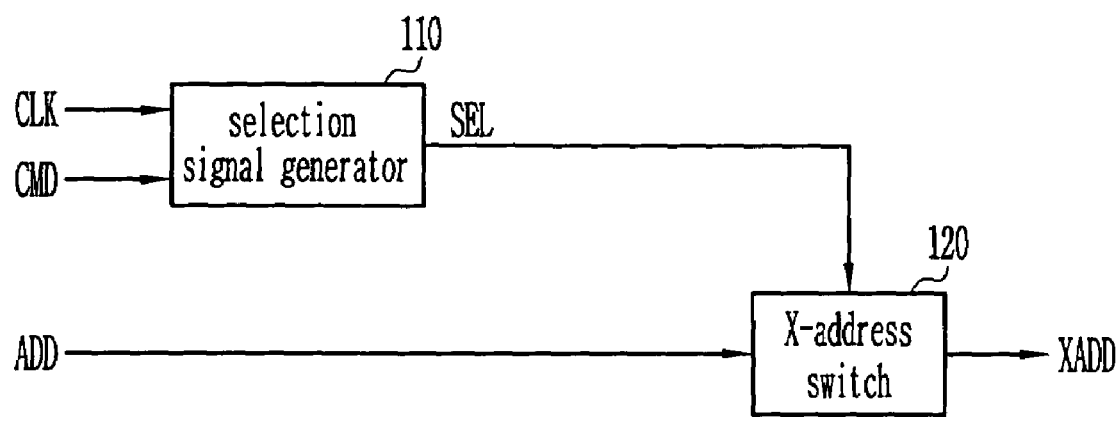
FIG. 1 is a block diagram of an X-address abstractor according to a conventional art.
Figure 2:
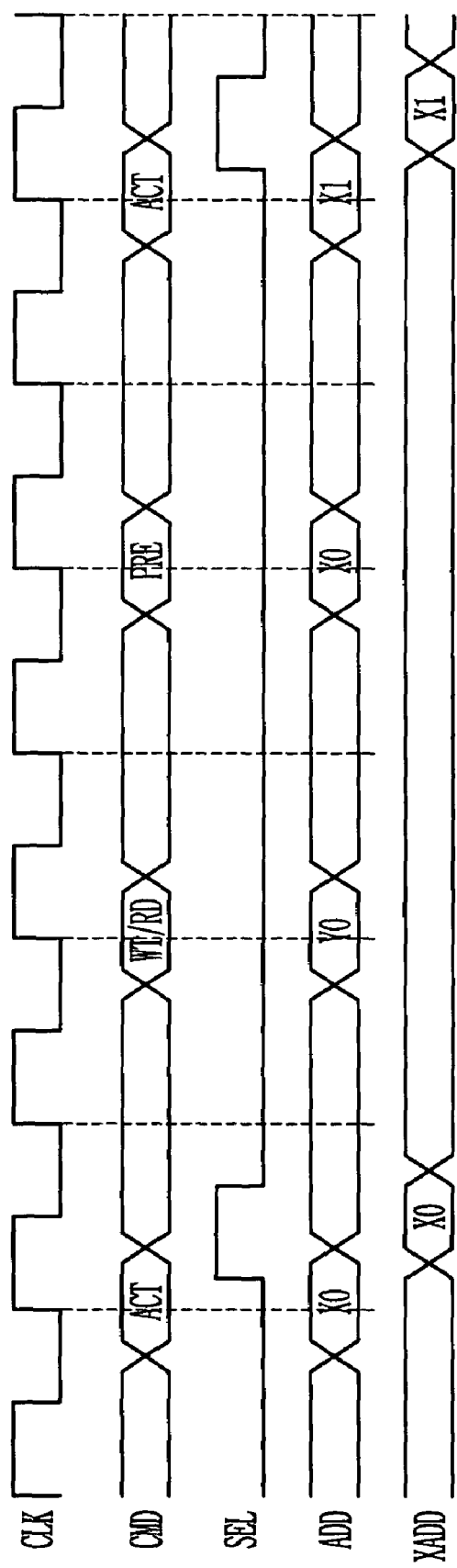
FIG. 2 is a timing diagram of the X-address abstractor according to a conventional art.

Referring now to the drawings wherein like or similar elements are designated with identical reference numerals throughout the several views and wherein various elements depicted are not necessarily drawn to scale. It should be understood that the description of the preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 3:
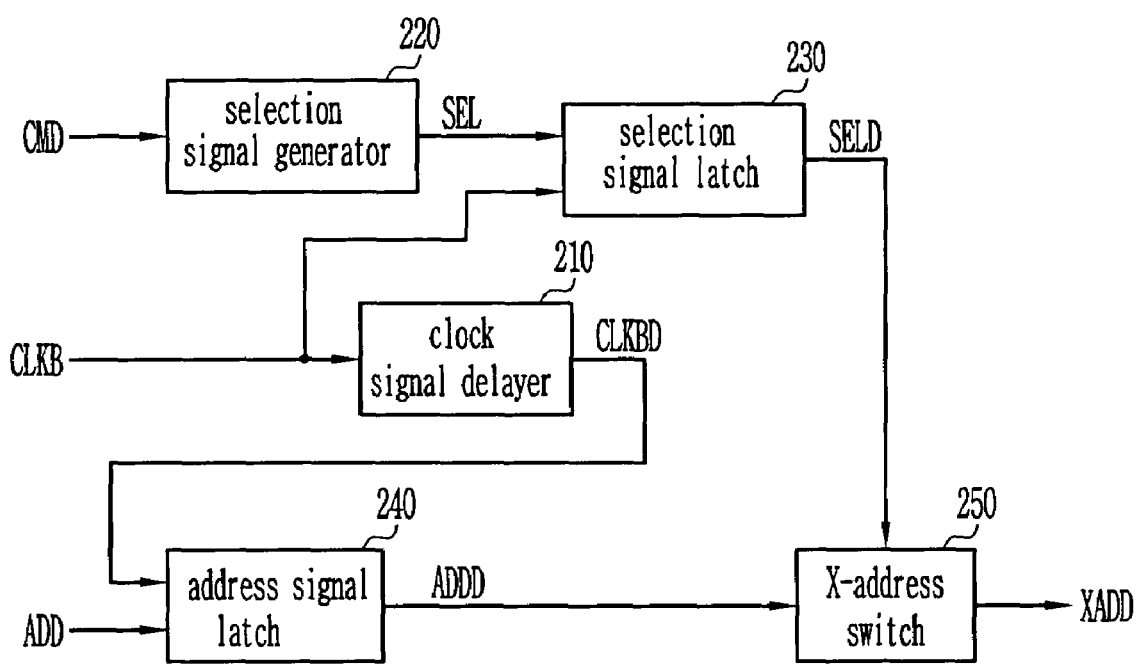
FIG. 3 is a block diagram of an X-address extractor according to a first embodiment of the present invention.
Figure 4:
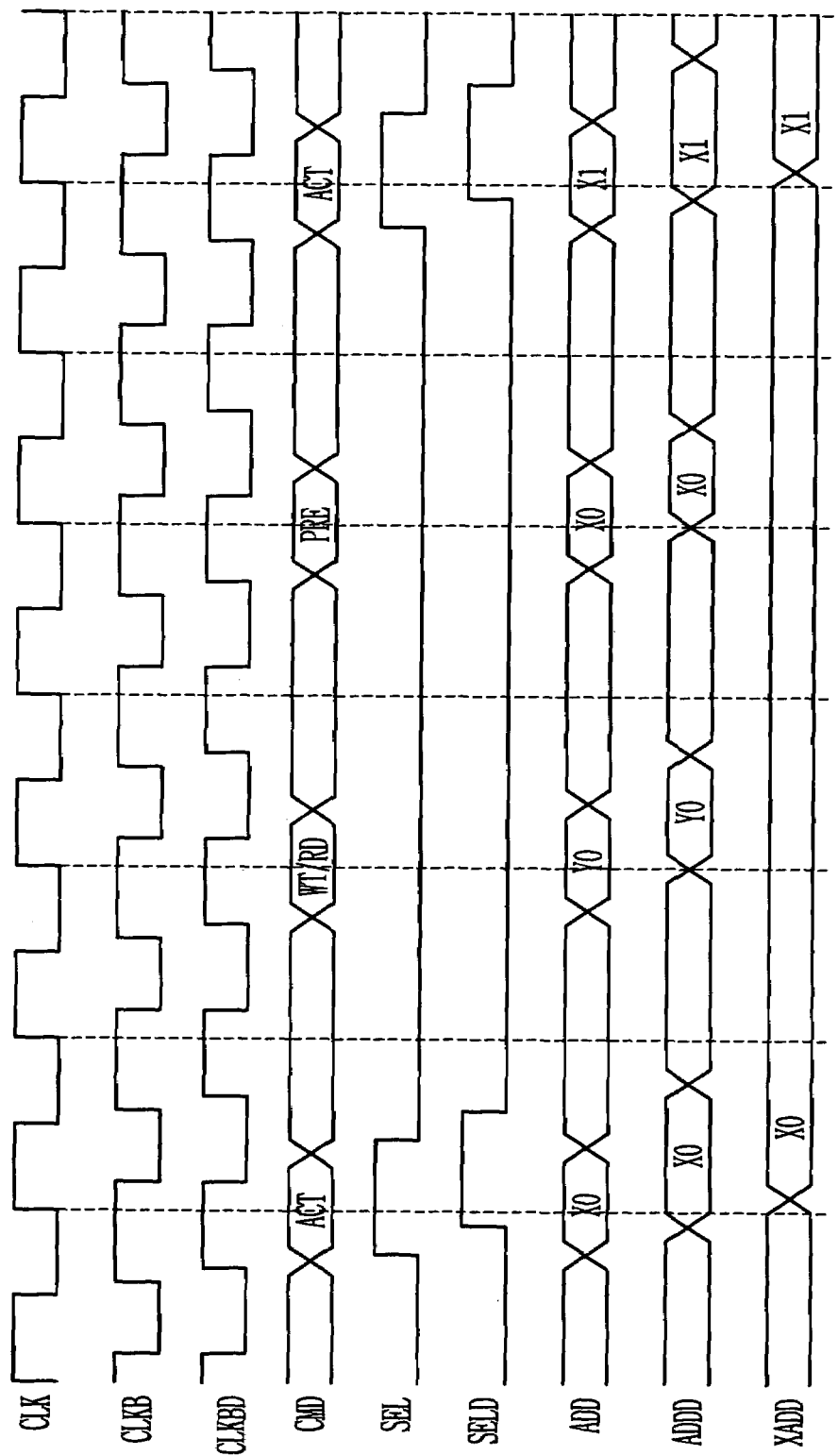
FIG. 4 is a timing diagram of the X-address extractor according to the first embodiment of the present invention.

Hereinafter, it is described about an X-address extractor according to a first embodiment of the invention in conjunction with FIGS. 3 and 4. FIG. 3 is a block diagram of an X-address extractor according to an embodiment of the present invention, and FIG. 4 is a timing diagram of the X-address extractor according to an embodiment of the present invention.

In FIG. 3, the X-address extractor includes a clock signal delayer 210, a selection signal generator 220, a selection signal latch 230, an address signal latch 240, and an X-address switch 250.

The clock signal delayer 210 receives a reversed clock signal CLKB and then outputs a delayed-reversed clock signal CLKBD. The clock signal delayer 210 can also delay only the position of a rising edge of the reversed clock signal CLKB. FIG. 4 shows the reversed clock signal CLKB and the delayed-reversed clock signal CLKBD.

The selection signal generator 220 outputs a selection signal SEL in response to a command signal CMD. The selection signal SEL retains logic '1' when the command signal CMD is an active command, while retains logic '0' when the command signal CMD is not an active command. FIG. 4 illustrates a timing diagram of the command signal CMD and the selection signal SEL.

The selection signal latch 230 receives the selection signal SEL and the reversed clock signal CLKB and then outputs a delayed selection signal SELD. If the reversed clock signal CLKB is logic '1', the delayed selection signal SELD has the value of the selection signal SEL. If the reversed clock signal CLKB is logic '0', the delayed selection signal SELD retains its previous value.

The address signal latch 240 receives an address signal ADD and the delayed-reversed clock signal CLKBD and then outputs a delayed address signal ADDD. If the delayed-reversed clock signal CLKBD is logic '1', the delayed address signal ADDD has the value of the address signal ADD. If the delayed-reversed clock signal CLKBD is logic '0', the delayed address signal ADDD retains its previous value. FIG. 4 depicts the states of the address signal ADD, the delayed-reversed clock signal CLKBD, and the delayed address signal ADDD.

The X-address switch 250 receives the delayed address signal ADDD and the delayed selection signal SELD and then outputs an X-address signal XADD. If the delayed selection signal SEL is logic '1', the delayed address signal ADDD becomes the X-address signal XADD. If the delayed selection signal SELD is logic '0', the X-address signal XADD retains its previous value. FIG. 4 represents the states of the delayed address signal ADDD, the delayed selection signal SELD, and the X-address signal XADD.

As illustrated in FIG. 4, the X-address extractor according to the first embodiment of the present invention normally operates even when the selection signal SEL changes to the inactive logical value from the active logical value after the address signal ADD changes from an X-address to another value. In other words, while in the conventional X-address extractor the X-address signal XADD has another value not an X-address in the case, the X-address extractor according to the first embodiment of the present invention makes enables the X-address signals XADD to have a normal X-address. Moreover, the X-address extractor according to the first embodiment of the present invention has an advantage of enabling an output time of the X-address signal XADD to be earlier than the conventional case, which properly contributes to improving a high speed operation of a memory.

Hereinafter, it will be described about practical implementations of elements of the X-address extractor according to an embodiment of the present invention, in conjunction with FIGS. 5 through 11.

Figure 5:
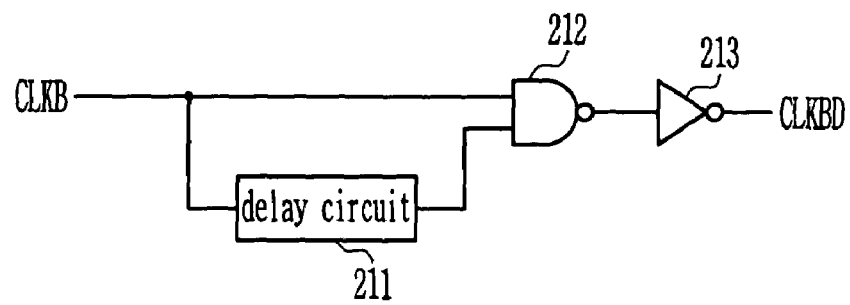
FIG. 5 is a circuit diagram of a clock signal delayer according to the first embodiment of the present invention.
Figure 6:
FIG. 6 is a circuit diagram of a delay circuit according to the first embodiment of the present invention.

FIG. 5 illustrates an implementation of the clock signal delayer. Referring to FIG. 5, the clock signal delayer outputs the reversed-delayed clock signal CLKBD in response to the reversed clock signal CLKB. The clock signal delayer is formed of a delay circuit 211, a NAND gate 212, and an inverter 213. The reversed clock signal CLKB and a signal output from the delay circuit 211 are applied to an AND logic circuit formed of the NAND gate 212 and the inverter 213. Then it results in the delayed-reversed clock signal CLKBD with a wider time domain of logical value '1' while with a narrower time domain of logic '0'. FIG. 6 is an example of the delay circuit 211 shown in FIG. 5. As illustrated in FIG. 6, the delay circuit 211 is formed of a plurality of inverters.

Figure 7:
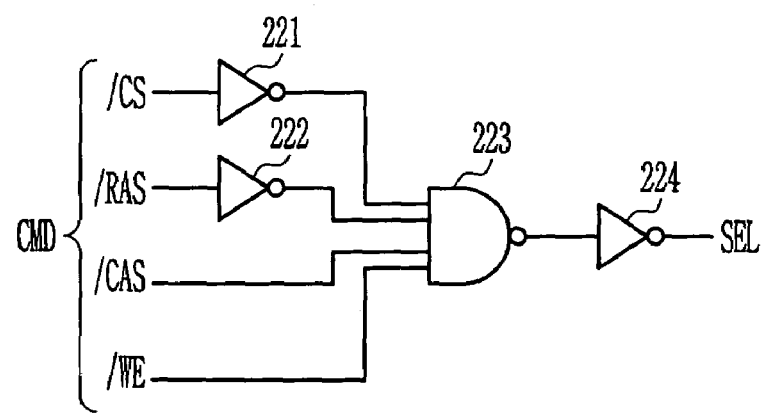
FIG. 7 is a circuit diagram of a selection signal generator according to the first embodiment of the present invention.

FIG. 7 illustrates an implementation of the selection signal generator. Referring to FIG. 7, the selection signal generator receives the command signal CMD formed of /CS, /RAS, /CAS, and /WE and outputs the selection signal SEL. The selection signal generator is comprised of third inverters 221, 222, and 224 and a 4-input NAND gate 223. If /CS='0', /RAS='0', /CAS='1', and /WE='1', the selection signal SEL becomes logic '1', i.e., the active logical value.

Figure 8:
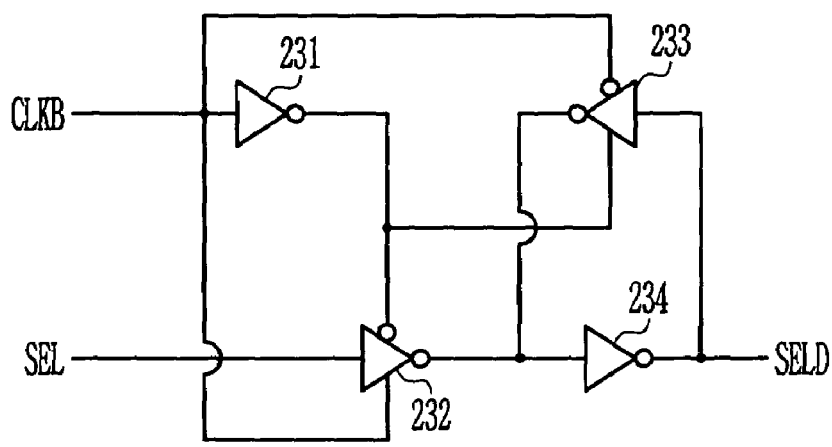
FIG. 8 is a circuit diagram of a selection signal latch according to the first embodiment of the present invention.
Figure 9:
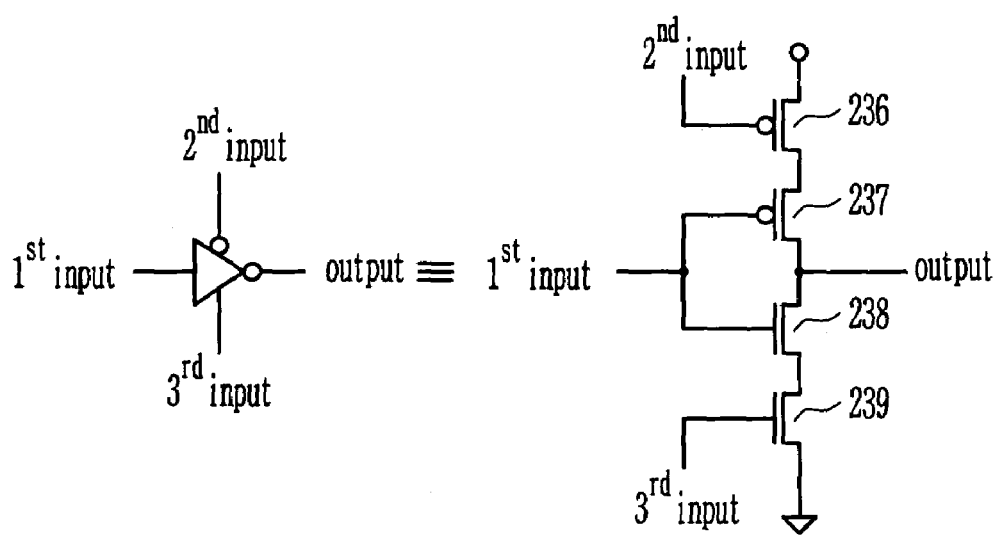
FIG. 9 is a circuit diagram of a clocked inverter according to the first embodiment of the present invention.

FIG. 8 illustrates an implementation of the selection signal latch. Referring to FIG. 8, the selection signal latch receives the reversed clock signal CLKB and the selection signal SEL and then outputs the delayed selection signal SELD. The selection signal latch is composed of two inverters 231 and 234, a first clocked inverter 232, and a second clocked inverter 233. An example of the clocked inverters 232 and 233 is illustrated in FIG. 9. Referring to FIG. 9, the clocked inverter is constructed of two PMOS transistors 236 and 237, and two NMOS transistors 238 and 239. In the clocked inverter, an output is a signal reversed from a first input when a second input is logic '0' and a third input is logic '1', or conditioned at a high impedance when the second input is logic '1' and the third input is logic '0'. In FIG. 8, if the reversed clock signal CLKB is logic '1', the first clocked inverter 232 outputs a reversed selection signal because the second input is logic '0' and the third input is logic '1'. The reversed selection signal is converted to the delayed selection signal SELD after being reversed again. During this, an output of the second clocked inverter 233 is being on a high impedance state. If the reversed clock signal CLKB is logic '0', the second clocked inverter 233 outputs the reversed selection signal SELD because the second input is logic '0' and the third input is logic '1'. During this, as the output of the first clocked inverter 232 is in a high impedance state, the delayed selection signal SELD retains its precious value. By the operation of the selection signal latch aforementioned, the delayed selection signal SELD becomes the selection signal SEL when the reversed clock signal CLKB is logic '1', while retains its previous value when the reversed clock signal is logic '0'.

Figure 10:
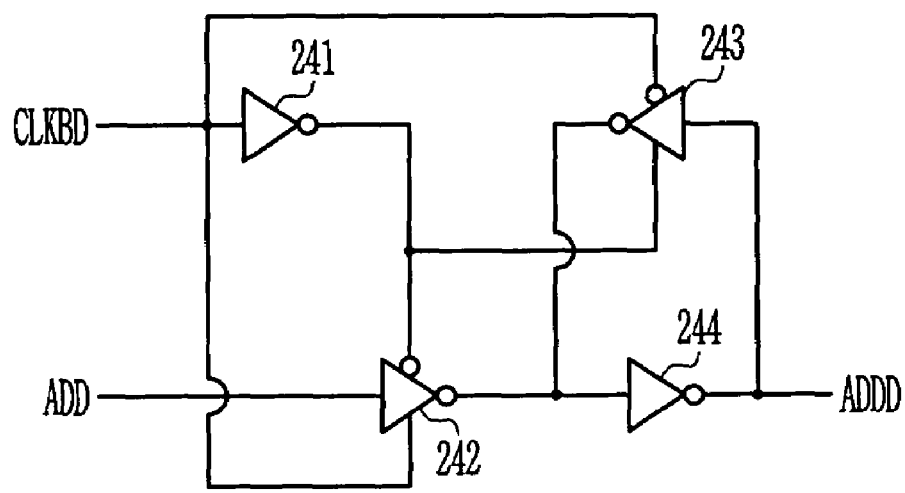
FIG. 10 is a circuit diagram of an address signal latch according to the first embodiment of the present invention.

FIG. 10 illustrates an implementation of the address signal latch. The address signal latch of FIG. 10 is constructed as similar to the selection signal latch shown in FIG. 8, except its input signals CLKBD and ADD and its output signal ADDD. Therefore, the delayed address signal ADDD becomes the address signal ADD when the delayed-reversed clock signal CLKBD is logic '1', while retains its previous value when the delayed-reversed clock signal CLKBD is logic '0'.

Figure 11:
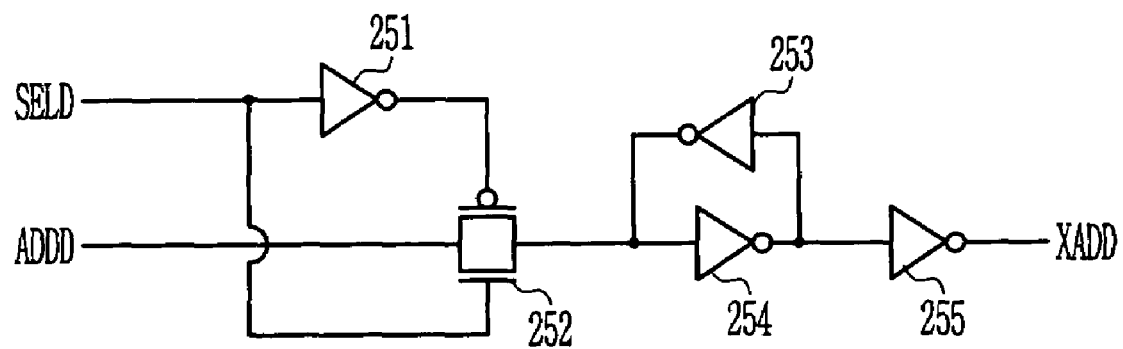
FIG. 11 is a circuit diagram of an X-address switch according to the first embodiment of the present invention.

FIG. 11 is an implementation of the X-address switch. Referring to FIG. 11, the X-address switch receives the delayed selection signal SELD and the delayed address signal ADDD and then outputs the X-address signal XADD. The X-address switch is comprised of four inverters 251, 253, 254, and 255, and a pass transistor 252. The pass transistor 252 is formed of a PMOS transistor and an NMOS transistor. A source/drain of the PMOS transistor is connected to a source/drain of the NMOS transistor to act as a first source/drain of the pass transistor 252. The other source/drain of the PMOS transistor is connected to the other source/drain of the NMOS transistor to act as a second source/drain of the pass transistor 252. When the delayed selection signal SELD becomes logic '1' of the active logical value, the pass transistor 252 is turned on to transfer the delayed address signal ADDD from the first source/drain to the second source/drain. The delayed address signal ADDD transferred to the second source/drain is converted to the X-address signal after passing through the two inverters 254 and 255. When the delayed selection signal SELD becomes logic '0' of the inactive logical value, the pass transistor 252 is turned off to make the X-address signal XADD maintain its previous value by a pair of the inverters 253 and 254. By the operation of the X-address switch aforementioned, the delayed address signal ADDD becomes the address signal ADD only when the delayed selection signal SELD is logic '1' as the inactive logical value, while retains its previous value when the selection signal is logic '0' as the active logical value.

Figure 12:
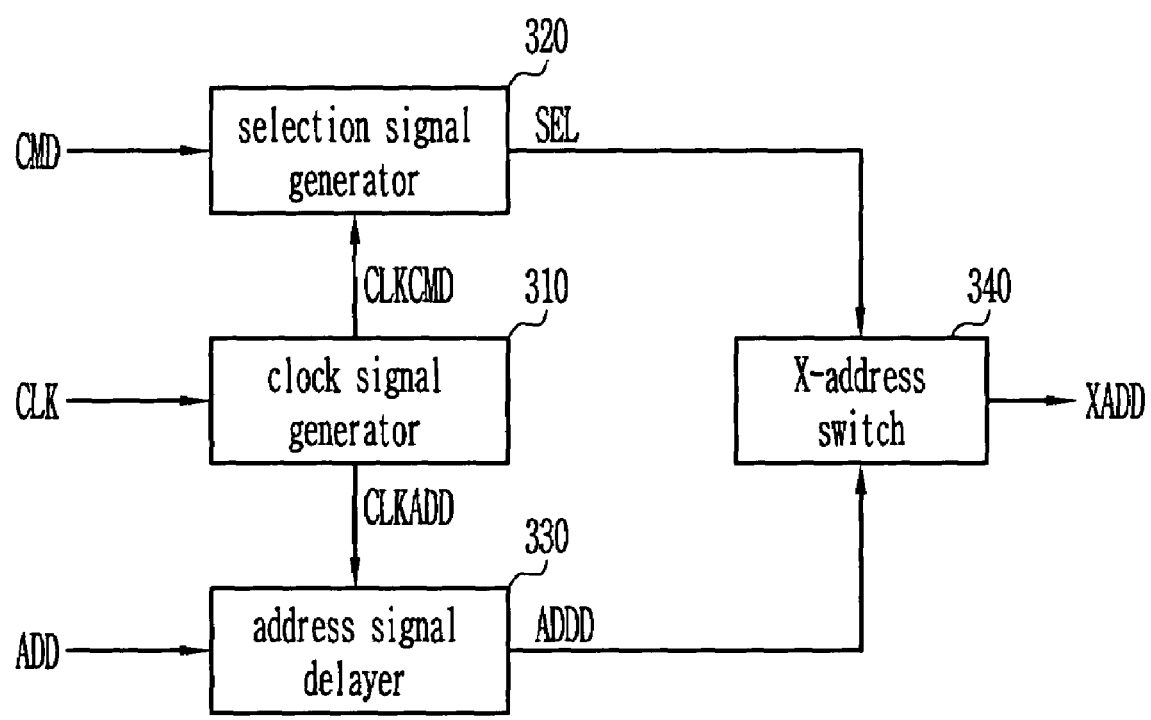
FIG. 12 is a block diagram of an X-address extractor according to a second embodiment of the present invention.
Figure 13:
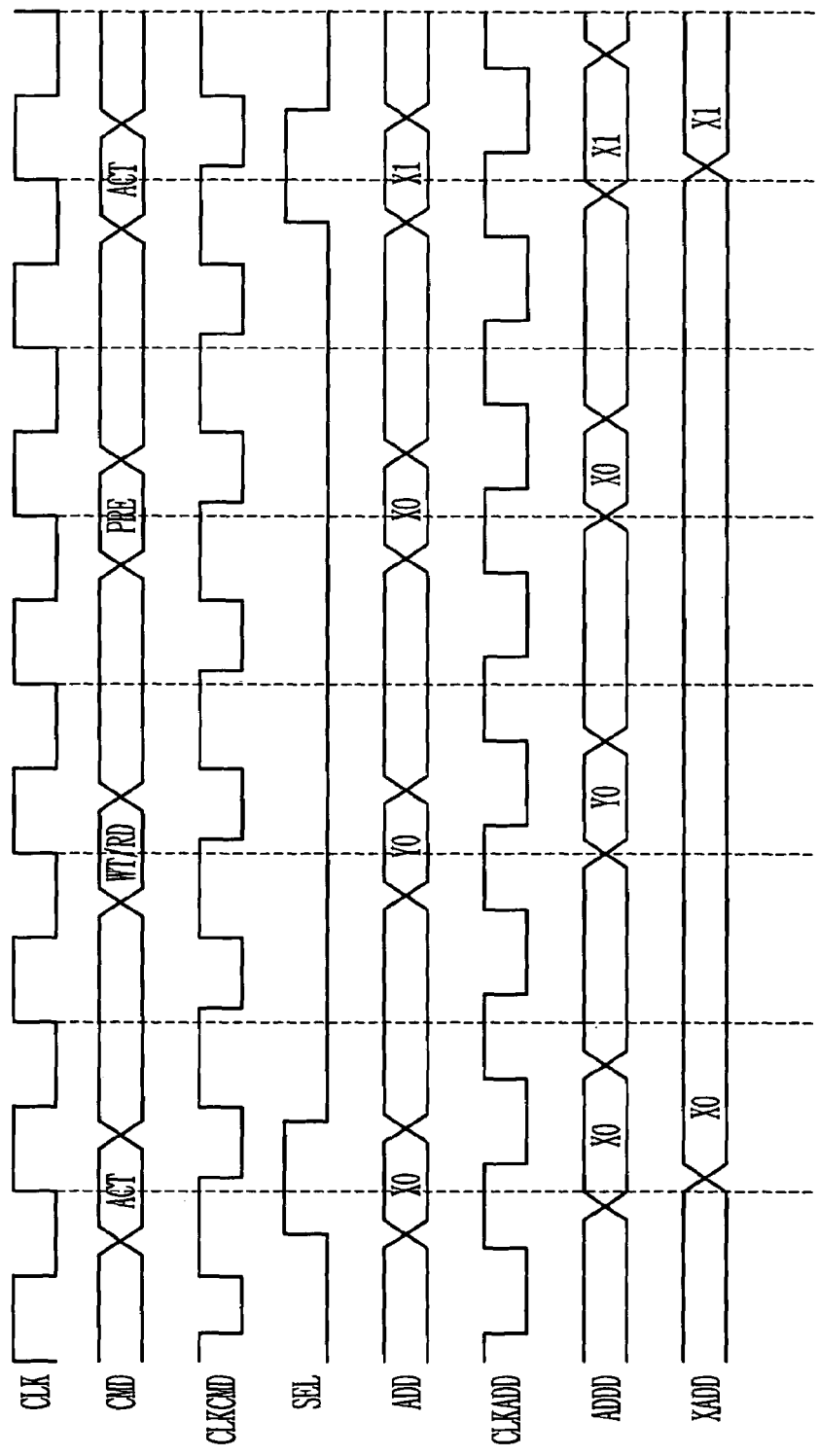
FIG. 13 is a timing diagram of the X-address extractor according to the second embodiment of the present invention.

Hereinafter, it will be described about an X-address extractor in accordance with a second embodiment of the present invention, with reference to FIGS. 12 and 13. FIG. 12 is a block diagram of an X-address extractor according to a second embodiment of the present invention, and FIG. 13 is a timing diagram of the X-address extractor according to the second embodiment of the present invention.

The X-address extractor includes a clock signal generator 310, a selection signal generator 320, an address signal delayer 330, and an X-address switch 340.

The clock signal generator 310 inputs the clock signal CLK and then outputs a command clock signal CLKCMD and an address clock signal CLKADD.

The command clock signal CLKCMD has a single edge in a period for which an active command is input by the command signal CMD. The single edge is referred to as a first edge in this embodiment. The first edge is one of rising and falling edges. An edge after the first edge is referred to as a second edge. The second edge is one of rising and falling edges, not the first edge. It is further assumed that a logic value before the first edge is a first logic value and a logic value after the first edge is a second logic value. The first logic value may be one of logic '1' and '0', and the second logic value may be, not the first logic value, one of logic '1' and '0'.

The address clock signal CLKADD has a single edge in a period for which an X-address is input by the address signal ADD. The single edge is referred to as a third edge in this embodiment. The third edge is one of rising and falling edges. An edge after the third edge is referred to as a fourth edge. The fourth edge is one of rising and falling edges, not the third edge. It is further assumed that a logic value before the first edge is a third logic value and a logic value after the first edge is a fourth logic value. The third logic value may be one of logic '1' and '0', and the fourth logic value may be, not the first logic value, one of logic '1' and '0'.

The second edge should be positioned prior to the fourth edge. Locations of the first and second edges is preferred to be settled by regarding jitter, setup time, and hold time.

FIG. 13 illustrates the cooperative relation between the command signal CMD, the command clock signal CLKCMD, the address signal ADD, and the address clock signal CLKADD when the first logic value is logic '1' and the third logic value is logic '1'.

The selection signal generator 320 inputs the command clock signal CLKCMD and the command signal CMD and then outputs the selection signal SEL.

In the condition that the command clock signal CLKCMD is the first logic value, the selection signal SEL is output with a fifth logic value when the command signal CMD is an active command, while with a sixth logic value when the command signal CMD is not an active command. When the command clock signal CLKCMD is the second logic value, the selection signal SEL retains its previous value. The fifth logic value may be one of logic '1' and '0', and the sixth logic value may be, not the first logic value, one of logic '1' and '0'. FIG. 13 also illustrates the cooperative relation between the command clock signal CLKCMD, the command signal CMD, and the selection signal SEL when the first logic value is logic '1' and the fifth logic value is logic '1'.

The address signal delayer 330 receives the address clock signal CLKADD and the address signal ADD and then outputs the delayed address signal ADDD.

When the address clock signal CLKADD is the third logic value, the address signal ADD directly becomes the delayed address signal ADDD. When the address clock signal CLKADD is the fourth logic value, the delayed address signal ADDD retains its previous value. FIG. 13 also illustrates the cooperative relation between the address clock signal CLKADD, the address signal ADD, and the delayed address signal ADDD when the third logic value is logic '1'.

The X-address switch 340 receives the selection signal SEL and the delayed address signal ADDD and then outputs the X-address signal XADD.

When the selection signal SEL is the fifth logic value, the delayed address signal ADDD directly becomes the X-address signal XADD. When the selection signal SEL is the sixth logic value, the X-address signal XADD retains its previous value. FIG. 13 also illustrates the cooperative relation between the selection signal SEL, the delayed address signal ADDD, and the X-address signal XADD when the fifth logic value is logic '1'.

As illustrated in FIG. 13, the X-address extractor according to the second embodiment of the present invention normally operates even when the selection signal SEL changes to the inactive logical value from the active logical value after the address signal ADD changes from an X-address to another value. In other words, while in the conventional X-address extractor the X-address signal XADD has another value not an X-address in the case, the X-address extractor according to the second embodiment of the present invention makes enables the X-address signals XADD to have a normal X-address. Moreover, the X-address extractor according to the second embodiment of the present invention has an advantage of enabling an output time of the X-address signal XADD to be earlier than the conventional case, which properly contributes to improving a high speed operation of a memory.

Figure 14:
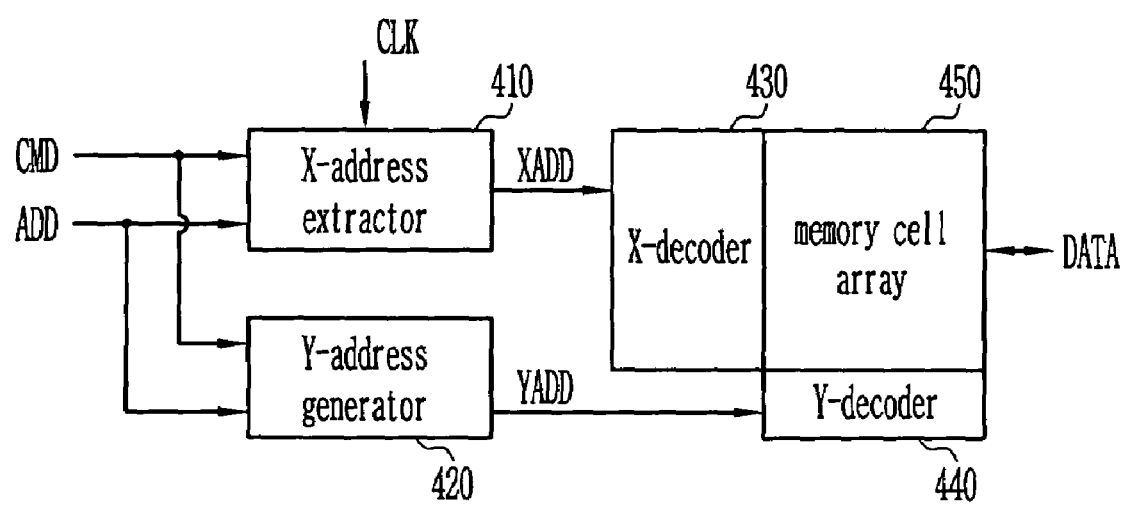
FIG. 14 illustrates a memory including the X-address extractor in accordance with the first or second embodiment of the present invention.

Hereinafter, it will be explained about a memory including the X-address extractor according to either the first or the second embodiment of the present invention, in conjunction with FIG. 14. FIG. 14 illustrates the memory embedding the present X-address extractor therein.

Referring to FIG. 10, the memory is comprised of an X-address extractor 410 (as same as the described formerly), a Y-address generator 420, an X-decoder 430, a Y-decoder 440, a memory cell array 450. Here, the X-address denotes a row address and the Y-address denotes a column address. The X-address extractor 410 is that described and illustrated above according to this embodiment of the present invention. The Y-address generator 420 creates the Y-address in response to the command signal CMD and the address signal ADD. The X-decoder 430 selects a low line assigned to the X-address signal XADD and the Y-decoder 440 selects a column line assigned to the Y-address signal YADD. The memory cell array 450 has a plurality of memory cells which are readable or writable with data, being designated with a low line selected by the X-address signal and a column line selected by the Y-address signal.

With the operation in the memory, data is written into or read from a memory cell in accordance with the X-address signal XADD obtained by the X-address extractor 410 and the Y-address signal YADD provided by the Y-address generator 420.

As aforementioned, the X-address extractor and the memory according to the present invention provides an advantage of offering a normal operation even when the selection signal changes to logic '1' from logic '0' after an address signal changes from an X-address to another value.

In addition, the X-address extractor according to the second embodiment of the present invention has an advantage of enabling an output time of the X-address signal XADD to be earlier than the conventional case.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An address extractor for obtaining a row address signal in response to a command signal, address signals including the row address signal and a column address signal, and a clock signal, comprising:
   a first element for outputting either a rising edge or a falling edge of the clock signal with a delay for a predetermined time;
   a second element for outputting a selection signal with a logic value variable in accordance with that the command signal is a predetermined command value;
   a third element for outputting the selection signal or retaining a previous output value, in accordance with a logic value of the clock signal;
   a fourth element for outputting the address signal or retaining a previous value, in accordance with a logic value of an output signal of the first element; and
   a fifth element for outputting an output signal of the fourth element as the row address signal or retaining a previous value, in accordance with a logic value of an output signal of the third element.

2. The address extractor of claim 1, wherein the first element comprises:
   a delay circuit for delaying the clock signal by a predetermined time;
   a NAND gate for receiving the clock signal and an output signal of the delay circuit; and
   an inverter for outputting the output signal of the first element in response to an output signal of the NAND gate.

3. The address extractor of claim 2, wherein the delay circuit is composed of a plurality of inverters connected in series.

4. The address extractor of claim 1,
   wherein the third element comprises a first inverter, a second inverter, a first clocked inverter, and second clocked inverter;
   wherein the first inverter receives the clock signal;
   wherein a first input terminal of the first clocked inverter receives the selection signal, a second input terminal of the first clocked inverter is connected to an output terminal of the first inverter, and a third input terminal of the first clocked inverter receives the clock signal;
   wherein a first input terminal of the second clocked inverter is connected to an output terminal of the second inverter, a second input terminal of the second clocked inverter receives the clock signal, and a third input terminal of the second clocked inverter is connected to the output terminal of the first inverter;
   wherein an output terminal of the first clocked inverter and an output terminal of the second clocked inverter are connected to an input terminal of the second inverter; and
   wherein the second inverter outputs the output signal of the third element.

5. The address extractor of claim 4, wherein the clocked inverter comprises a first PMOS transistor, a second PMOS transistor, a first NMOS transistor, and a second NMOS transistor;
  wherein a first input is connected to a gate of the first PMOS transistor and a gate of the first NMOS transistor;
  wherein a second input is a gate of the second PMOS transistor; wherein a third input is connected to a gate of the second NMOS transistor;
  wherein an output is connected to a first source/drain of the first PMOS transistor and a first source/drain of the first NMOS transistor;
  wherein a second source/drain of the first PMOS transistor is connected to a first source/drain of the second PMOS transistor; wherein a second source/drain of the first NMOS transistor is a first source/drain of the second NMOS transistor;
  wherein a second source/drain of the second PMOS transistor is connected to a high voltage source; and
  wherein a second source/drain of the second NMOS transistor is connected to a low voltage source.

6. The address extractor of claim 1,
  wherein the fourth element comprises a first inverter, a second inverter, a first clocked inverter, and second clocked inverter;
  wherein the first inverter inputs the output signal of the first element;
  wherein a first input terminal of the first clocked inverter inputs the address signal, a second input terminal of the first clocked inverter is connected to an output terminal of the first inverter, and a third input terminal of the first clocked inverter inputs the output signal of the first element;
  wherein a first input terminal of the second clocked inverter is connected to an output terminal of the second inverter, a second input terminal of the second clocked inverter inputs the output signal of the first element, and a third input terminal of the second clocked inverter is connected to the output terminal of the first inverter;
  wherein an output terminal of the first clocked inverter and an output terminal of the second clocked inverter are connected to an input terminal of the second inverter; and
  wherein the second inverter outputs the output signal of the fourth element.

7. The address extractor of claim 1,
  wherein the fifth element comprises a first inverter, a second inverter, a third inverter, a fourth inverter, and a pass transistor;
  wherein the first inverter inputs the output signal of the third element;
  wherein a first source/drain of the pass transistor inputs the output signal of the fourth element, a PMOS gate of the pass transistor is connected to an output terminal of the first element, and an NMOS gate of the pass transistor inputs the output signal of the third element;
  wherein an input terminal of the second inverter is connected to an output terminal of the third inverter;
  wherein a second source/drain of the pass transistor and an output terminal of the second inverter are connected to an input terminal of the third inverter;
  wherein an input terminal of the fourth inverter is connected to an output terminal of the third inverter; and
  wherein an output terminal of the fourth inverter outputs an output signal of the fifth element.

8. An address extractor for generating an output address signal in response to a command signal transferring a first command and a second command but the first command, an address signal transferring a first address and a second address but the first address, and a clock signal, the address extractor comprising:
  a first element for outputting a command clock signal and an address clock signal, the command clock signal having a first edge in a period when the command signal is a the first command and a second edge after the period of the first command, the command clock signal having a first logic value before the first edge and a second logic value after the first edge, the address clock signal having a third edge in a period when the address signal is the first address and a fourth edge after the period of the first address, the address clock signal having a third logic value before the third edge and a fourth logic value after the third edge, the second edge being positioned before the fourth edge;
  a second element for outputting a fifth logic value when the command clock signal is the first logic value and the command signal is the first command, outputting a sixth logic value when the command clock signal is the first logic value and the command signal is the second command, and retaining a previous output value when the command clock signal is the second logic value;
  a third element for outputting the address signal when the address clock signal is the third logic value and retaining a previous output value when the address clock signal is the fourth logic value; and
  a fourth element for outputting an output signal of the third element as the output address signal when an output signal of the second element is the fifth logic value and retaining a previous output value when the output signal of the second element is the sixth logic value.

9. A memory comprising:
  a row address extractor as set forth in one of claims 1 through 8, for outputting a row address in response to a clock signal, an address signal, and a command signal;
  a column address generator for creating a column address in response to the address signal and the command signal;
  a row decoder for selecting a row line in accordance with the row address;
  a column decoder for selecting a column line in accordance with the column address; and
  a memory cell array including plurality of memory cells which are readable or writable with data, being designated with a low line selected by the X-address signal and a column line selected by the Y-address signal.

* * * * *

UNITED STATES PATENT AND TRADEMARK OFFICE
CERTIFICATE OF CORRECTION

PATENT NO. : 7,106,648 B2  Page 1 of 1
APPLICATION NO. : 10/878824
DATED : September 12, 2006
INVENTOR(S) : Min Y. You It is certified that error appears in the above-identified patent and that said Letters Patent is hereby corrected as shown below:

On the Title Page:

Item (54), "X-ADDRESS" should be -- X ADDRESS --.

Item (73), "Hynix Semiconductor, Inc." should be -- Hynix Semiconductor Inc. --.

Column 10, line 15, "is a the" should be -- is the --.

Signed and Sealed this

Seventh Day of August, 2007

JON W. DUDAS
*Director of the United States Patent and Trademark Office*